United States Patent
Choi et al.

(10) Patent No.: US 12,335,681 B2
(45) Date of Patent: Jun. 17, 2025

(54) ELECTRONIC DEVICE INCLUDING SOUND MODULE

(71) Applicant: Samsung Electronics Co., Ltd., Suwon-si (KR)

(72) Inventors: Seungkwon Choi, Suwon-si (KR); Hakrae Kang, Suwon-si (KR); Jinwoo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 98 days.

(21) Appl. No.: 17/976,355

(22) Filed: Oct. 28, 2022

(65) Prior Publication Data
US 2023/0052402 A1   Feb. 16, 2023

Related U.S. Application Data

(63) Continuation of application No. PCT/KR2021/004000, filed on Mar. 31, 2021.

(30) Foreign Application Priority Data

May 21, 2020 (KR) .................... 10-2020-0061100

(51) Int. Cl.
| | | |
|---|---|---|
| *H04R 1/28* | (2006.01) | |
| *H04M 1/03* | (2006.01) | |
| *H05K 5/02* | (2006.01) | |

(52) U.S. Cl.
CPC .......... *H04R 1/2857* (2013.01); *H04M 1/035* (2013.01); *H05K 5/0217* (2013.01); *H04R 2499/11* (2013.01)

(58) Field of Classification Search
CPC .......... H04R 1/2857; H04R 2499/11
See application file for complete search history.

(56) References Cited

U.S. PATENT DOCUMENTS

| | | |
|---|---|---|
| 7,920,904 B2 | 4/2011 | Kim et al. |
| 8,055,003 B2 | 11/2011 | Mittleman et al. |
| (Continued) | | |

FOREIGN PATENT DOCUMENTS

| | | |
|---|---|---|
| KR | 10-2014-0050912 A | 4/2014 |
| KR | 10-2015-0112468 A | 10/2015 |
| (Continued) | | |

OTHER PUBLICATIONS

Extended European Search Report dated Aug. 21, 2023, issued in European Patent Application No. 21808014.1.
(Continued)

*Primary Examiner* — Suhan Ni
(74) *Attorney, Agent, or Firm* — Jefferson IP Law, LLP

(57) ABSTRACT

An electronic device is provided. The electronic device includes a first frame including a first surface, a second surface facing the direction opposite to that of the first surface, and a side surface encompassing the space between the first surface and the second surface, a guide path which is formed in the space of the first frame and which includes, from the side surface toward the space, an external environment connection hole formed at a specified depth, a first through-hole formed from the second surface up to the external environment connection hole, and a second through-hole formed at a location apart from the first through-hole so as to be formed from the first surface up to the second surface, and a sealing member including a sound module disposed on the first surface so as to correspond to the second through-hole, and a recess which is disposed on the second surface and connects the first through-hole to the second through-hole.

20 Claims, 16 Drawing Sheets

(56) References Cited

U.S. PATENT DOCUMENTS

| | | |
|---|---|---|
| 9,800,965 B2 | 10/2017 | Miehl et al. |
| 10,028,397 B2 | 7/2018 | Zhao et al. |
| 10,158,937 B2 | 12/2018 | Shao et al. |
| 10,425,712 B1 | 9/2019 | Chamberlin et al. |
| 10,827,257 B2 | 11/2020 | Sun et al. |
| 2014/0112518 A1 | 4/2014 | Lee |
| 2018/0279028 A1 | 9/2018 | Mittleman et al. |
| 2019/0098121 A1 | 3/2019 | Jeon et al. |
| 2019/0170716 A1 | 6/2019 | Sim et al. |
| 2019/0297429 A1 | 9/2019 | Zuo |
| 2019/0320050 A1 | 10/2019 | Lim et al. |
| 2020/0053446 A1 | 2/2020 | Gu |
| 2021/0314685 A1* | 10/2021 | Oster ................. H04R 1/02 |
| 2021/0352392 A1 | 11/2021 | Kim et al. |

FOREIGN PATENT DOCUMENTS

| | | | |
|---|---|---|---|
| KR | 10-2019-0034063 A | 4/2019 |
| KR | 10-2019-0066474 A | 6/2019 |
| KR | 10-2019-0121119 A | 10/2019 |
| KR | 10-2020-0038031 A | 4/2020 |

OTHER PUBLICATIONS

Korean Office Action dated Aug. 5, 2024, issued in Korean Application No. 10-2020-0061100.

\* cited by examiner

ELECTRONIC DEVICE INCLUDING SOUND MODULE

CROSS-REFERENCE TO RELATED APPLICATION(S)

This application is a continuation application, claiming priority under § 365 (c), of an International application No. PCT/KR2021/004000, filed on Mar. 31, 2021, which is based on and claims the benefit of a Korean patent application number 10-2020-0061100, filed on May 21, 2020, in the Korean Intellectual Property Office, the disclosure of which is incorporated by reference herein in its entirety.

BACKGROUND

1. Field

The disclosure relates to an electronic device including a sound sensor module.

2. Description of Related Art

An electronic device may include at least one electrical structure (e.g., an acoustic module or a sensor for detecting an external environment) that is disposed in an internal space thereof and that corresponds to an external environment. The electronic device may include a guide path that connects such an electrical structure and the external environment. The guide path needs to be provided with excellent sealing power for preventing the leakage of a sound transferred thereto and providing an accurate detection value.

The above information is presented as background information only to assist with an understanding of the disclosure. No determination has been made, and no assertion is made, as to whether any of the above might be applicable as prior art with regard to the disclosure.

SUMMARY

An electronic device may include at least one electrical structure that is disposed in an internal space thereof and that corresponds to an external environment. Such an electrical structure may include an acoustic module (e.g., a microphone module and/or a speaker module) or a sensor module. The electronic device may collect a sound from the outside, may discharge a generated sound and/or may sense an external environment by being connected to the acoustic module and/or the sensor module within the electronic device by using a guide path (e.g., a hole) formed through a housing. The guide path may be formed by the coupling of at least two structures (e.g., frames, housings, or brackets). The guide path may be sealed through a sealing member (e.g., a double-sided tape for sealing).

However, when the guide path serves as a sound guide path for the acoustic module, a sound leakage phenomenon in which a sound leaks may occur and performance degradation of the acoustic module may be caused due to the pushing or deformation of a sealing member occurring in a process of assembling the two structures or the degradation of airtightness attributable to the weakening of an adhesive force.

Aspects of the disclosure are to address at least the above-mentioned problems and/or disadvantages and to provide at least the advantages described below. Accordingly, an aspect of the disclosure, is to provide an electronic device including an acoustic module.

Another aspect of the disclosure is to provide an electronic device including a guide path having improved assembly property and sealing force.

Additional aspects will be set forth in part in the description which follows and, in part, will be apparent from the description, or may be learned by practice of the presented embodiments.

In accordance with an aspect of the disclosure, an electronic device is provided. The electronic device includes a first frame including a first surface, a second surface toward a direction opposite to the direction of the first surface, and a side surface surrounding a space between the first surface and the second surface, a guide path including an external environment connection hole formed at a designated depth from the side surface to the direction of the space, a first through hole formed from the second surface to the external environment connection hole, and a second through hole formed to be penetrated from the first surface to the second surface at a location spaced apart from the first through hole, as a guide path formed in the space of the first frame, an acoustic module disposed to correspond to the second through hole in the first surface, and a sealing member including a recess disposed in the second surface and connecting the first through hole and the second through hole.

In accordance with another aspect of the disclosure, an electronic device is provided. The electronic device includes a first frame including a first surface, a second surface toward a direction opposite to the direction of the first surface, and a side surface surrounding a space between the first surface and the second surface, a guide path including an external environment connection hole formed at a designated depth from the side surface to the direction of the space, a first through hole formed from the second surface to the external environment connection hole, and a second through hole formed to be penetrated from the first surface to the second surface at a location spaced apart from the first through hole, as a guide path formed in the space of the first frame, an electrical structure disposed to correspond to the second through hole in the first surface, and a sealing member including a recess disposed in the second surface and connecting the first through hole and the second through hole.

Various embodiments of the disclosure can improve an assembly property because the guide path is implemented in the one frame (or the housing) and can help to secure the reliability of the acoustic module because a sound leakage phenomenon is reduced. Furthermore, the various embodiments can help a change in the shape of the recess for the transfer of a sound because the guide path that connects two through holes is provided through the sealing member formed through an injection and/or an elastic material. Furthermore, the various embodiments may be advantageous in forming the guide path although the thickness of a frame is thin because the two through holes are connected through the sealing member.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
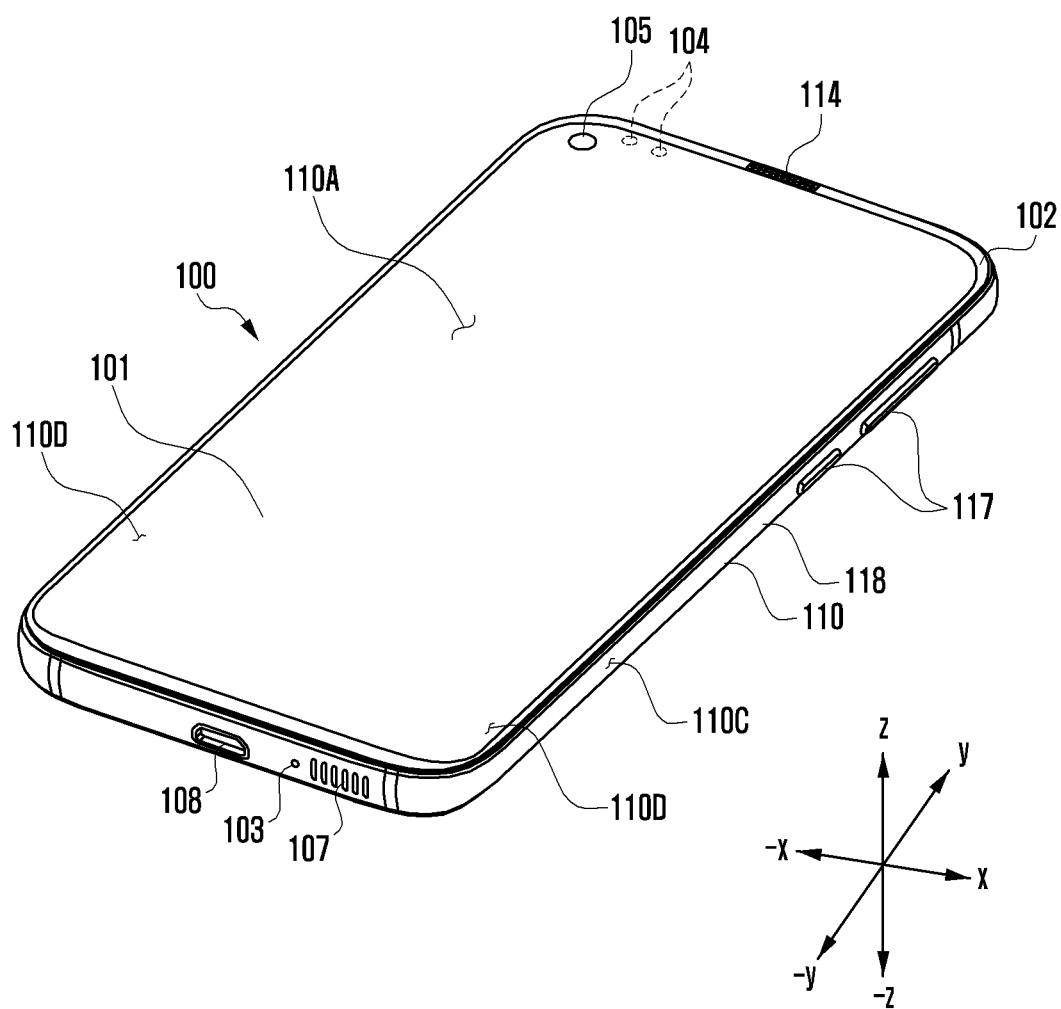
FIG. 1 is a perspective view of a front surface of an electronic device according to an embodiment of the disclosure.

FIG. 1 illustrates a perspective view showing a front surface of a mobile electronic device according to an embodiment of the disclosure.

Figure 2:
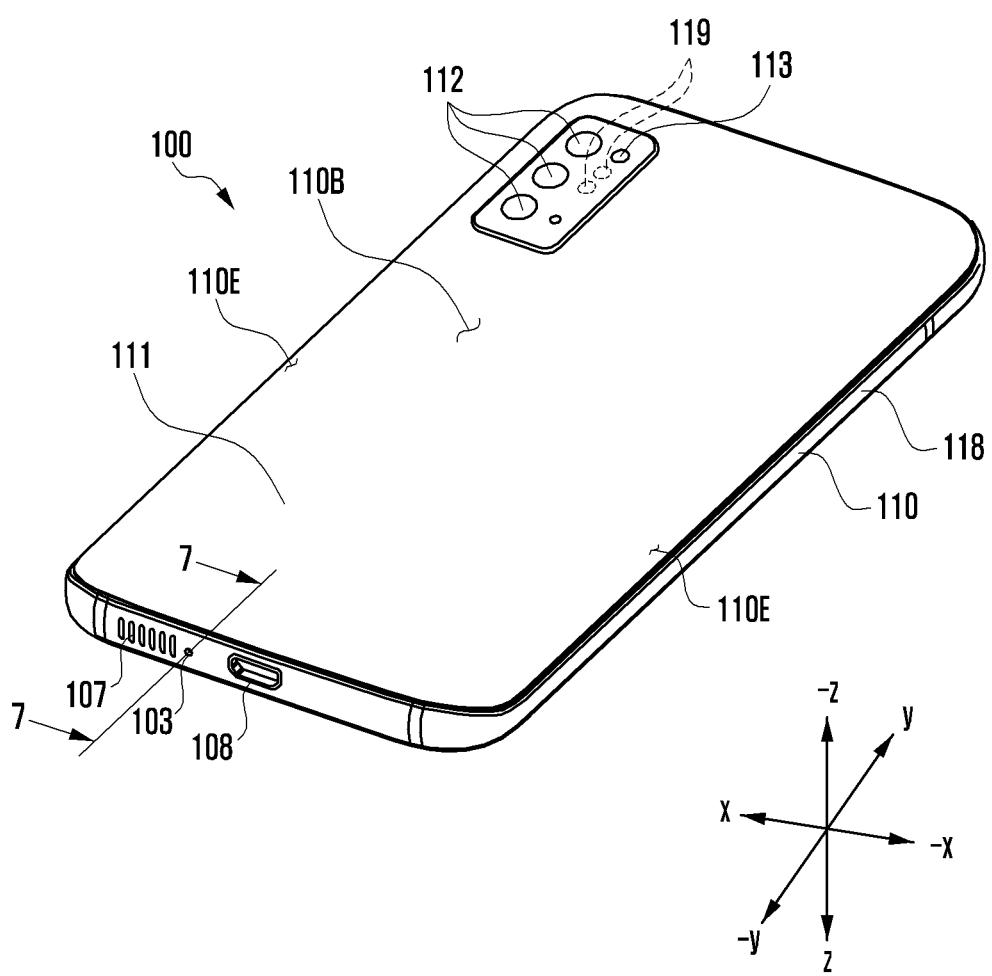
FIG. 2 is a perspective view of a rear surface of an electronic device in FIG. 1 according to an embodiment of the disclosure.

FIG. 2 illustrates a perspective view showing a rear surface of a mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material, such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and a connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch detection circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The mobile electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the mobile electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the mobile electronic device 100.

The key input device 117 may be disposed on the lateral surface 110C of the housing 110. The mobile electronic device 100 may not include some or all of the key input device 117 described above, and the key input device 117 which is not included may be implemented in another form, such as a soft key on the display 101. The key input device 117 may include the sensor module disposed on the second surface 110B of the housing 110.

The light emitting device may be disposed on the first surface 110A of the housing 110. For example, the light emitting device may provide status information of the mobile electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of the mobile electronic device 100 so as to be brought into contact with an external environment through an opening of the display 101, which is perforated up to a front plate 102. In another embodiment of the disclosure, some sensor modules 104 may be arranged to perform their functions without being visually exposed through the front plate 102 in the internal space of the electronic device. For example, in this case, an area of the display 101 facing the sensor module may not require a perforated opening.

Figure 3:
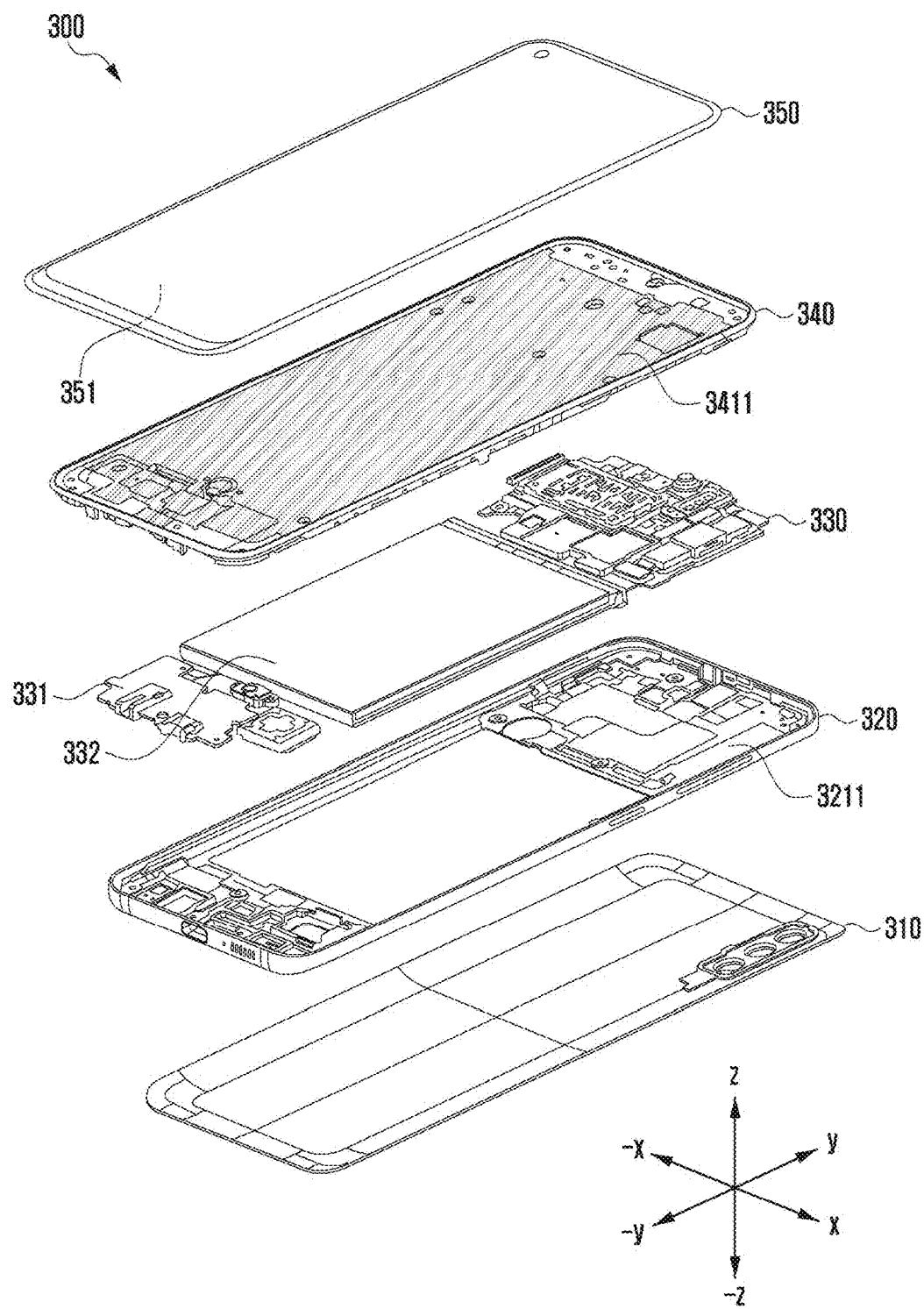
FIG. 3 is an exploded perspective view of an electronic device according to an embodiment of the disclosure.

FIG. 3 is an exploded perspective view of an electronic device according to an embodiment of the disclosure.

Referring to FIG. 3, an electronic device 300 may be at least partially similar to the mobile electronic device 100 in FIGS. 1 and 2 or may further include other embodiments of an electronic device.

With reference to FIG. 3, the electronic device 300 (e.g., the mobile electronic device 100 in FIG. 1 or 2) may include a rear cover 310, and a front cover 350 including a first frame 320, at least one printed circuit board 330 and 331, a battery 332, a second frame 340, and a display 351 that are sequentially stacked on the rear cover 310. According to one embodiment of the disclosure, the first frame 320 (e.g., a first side surface frame, a first housing, or a first side surface bezel structure) may at least partially form an external appearance (e.g., a side surface and/or a rear surface) of the electronic device 300, and may include a first support part 3211 (e.g., a first support member) that at least partially extends to an internal space thereof. According to one embodiment of the disclosure, the second frame 340 may also at least partially form an external appearance (e.g., the side surface and/or the front surface) of the electronic device 300, and may include a second support part 3411 (e.g., a second support member) that at least partially extends to an internal space thereof. According to one embodiment of the disclosure, the first frame 320 and the second frame 340 may be formed of a metal material and/or a polymer material.

According to various embodiments of the disclosure, the at least one printed circuit board 330 and 331 may be disposed to be supported by the first frame 320 and/or the second frame 340, and may include a processor, a memory and/or an interface. According to one embodiment of the disclosure, the at least one printed circuit board 330 and 331 may include a main board 330 and a sub-board 331. According to one embodiment of the disclosure, the processor may include one or more of a central processing unit, an application processor, a graphics processor, an image signal processor, a sensor hub processor, or a communication processor, for example. According to one embodiment of the disclosure, the memory may include a volatile memory or a nonvolatile memory, for example. According to one embodiment of the disclosure, the interface may include a high definition multimedia interface (HDMI), a universal serial bus (USB) interface, a secure digital (SD) card interface and/or an audio interface, for example. The interface may electrically or physically connect, for example, the electronic device 300 to an external electronic device, and may include a USB connector, an SD card/multi-media card (MMC) connector, or an audio connector.

According to various embodiments of the disclosure, the battery 332 may be disposed to be supported by the first frame 320 and/or the second frame 340. The battery 332 is a device for supplying power to at least one component of the electronic device 300, and may include a primary cell incapable of recharging, a secondary cell capable of recharging, or a fuel cell, for example. At least a part of the battery 332 may be disposed substantially on the same plane as the at least one printed circuit board 330 and 331, for example.

The battery 332 may be disposed within the electronic device 300 in an integrated way, and may be disposed in a way to be attachable to and detachable from the electronic device 300.

According to various embodiments of the disclosure, the display 351 may be at least partially supported by the second frame 340, and may be disposed in a way to be seen from the outside through at least a part of the front cover 350.

Figure 4:
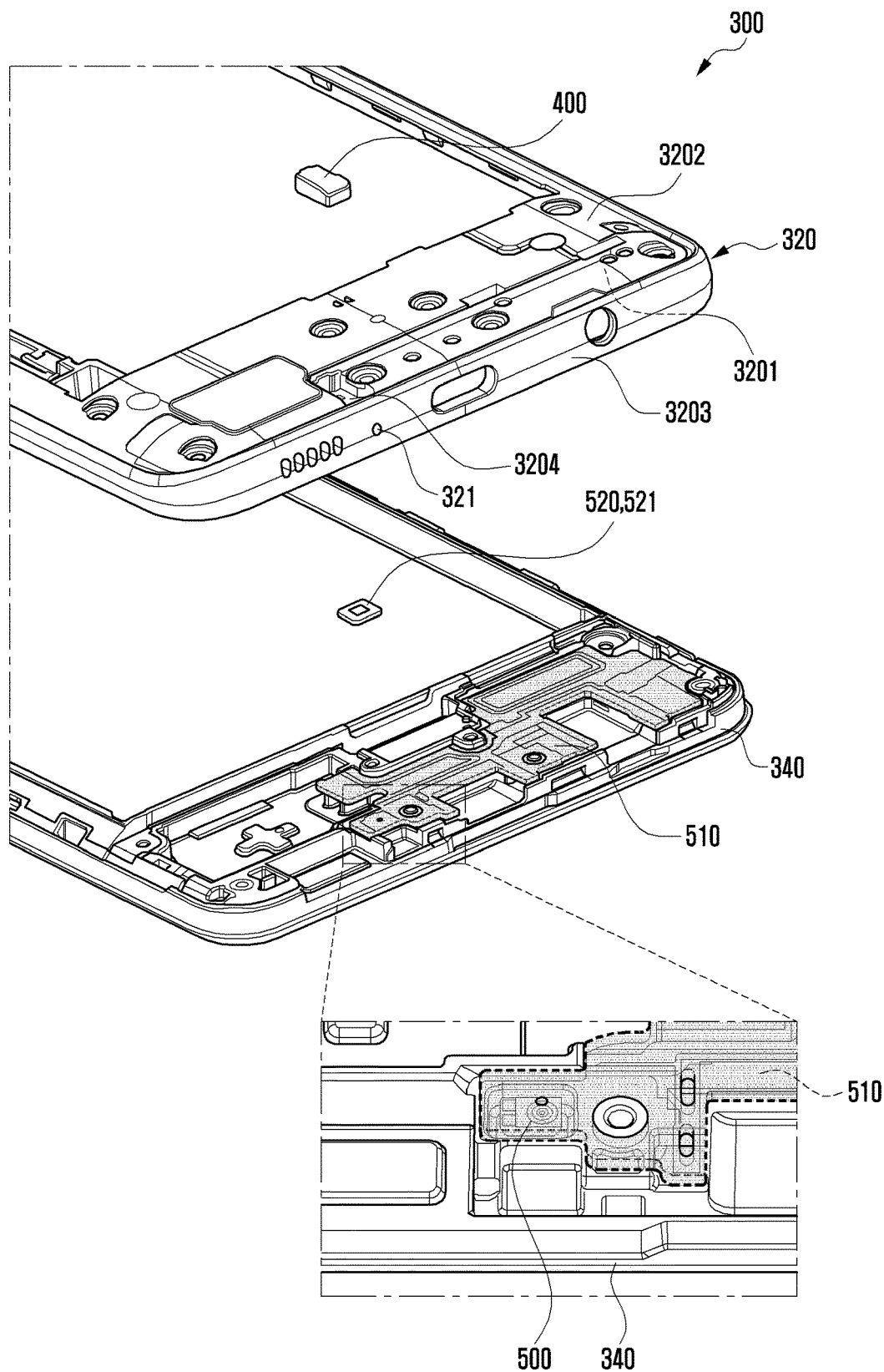
FIG. 4 is a perspective view of a part of an electronic device having an arrangement construction of an acoustic module according to an embodiment of the disclosure.

FIG. 4 is a perspective view of a part of an electronic device having an arrangement construction of an acoustic module according to an embodiment of the disclosure.

Figure 5:
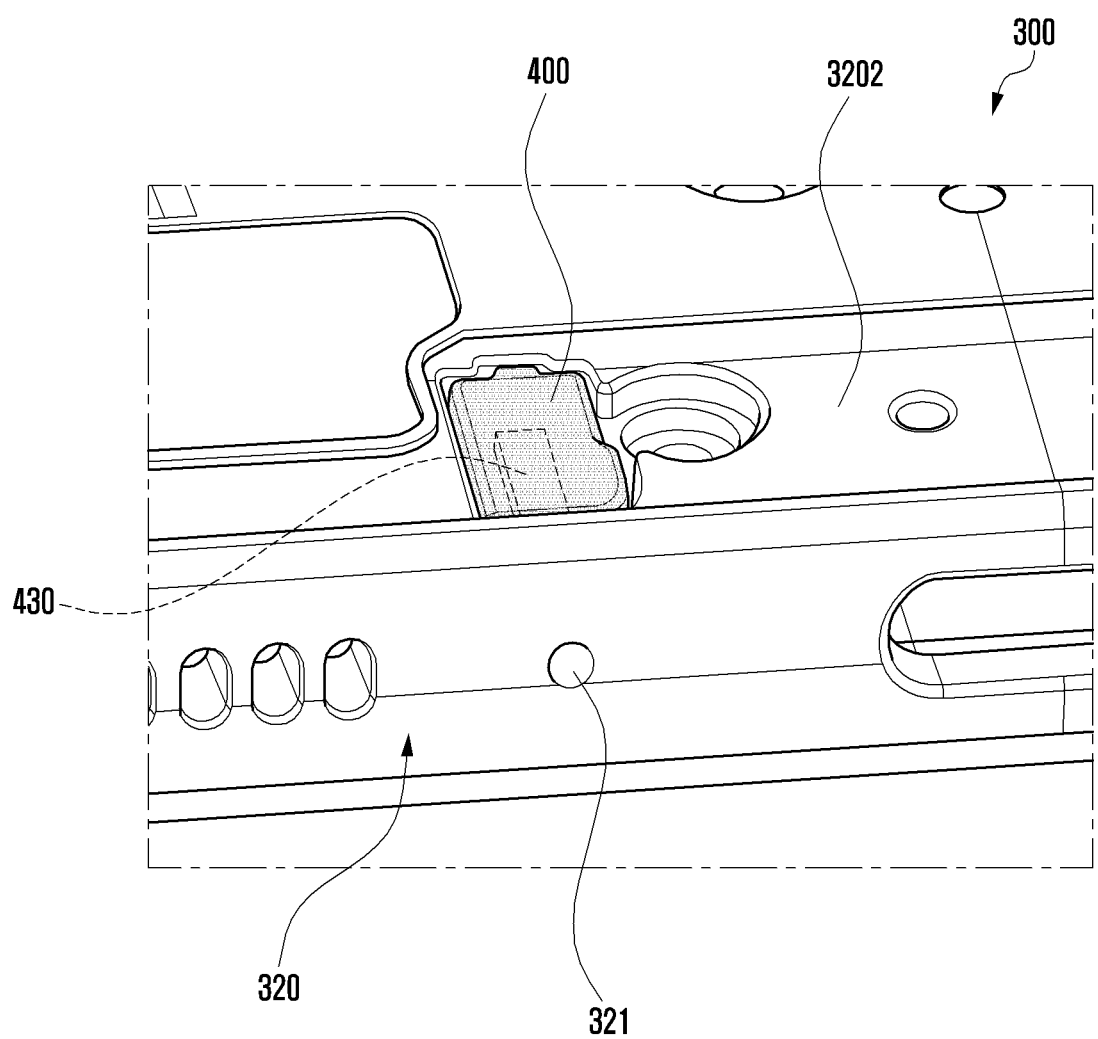
FIG. 5 is a perspective view of a part of a first frame in which a sealing member has been disposed according to an embodiment of the disclosure.

FIG. 5 is a perspective view of a part of a first frame in which a sealing member has been disposed according to an embodiment of the disclosure.

Referring to FIGS. 4 and 5, the electronic device 300 may include the first frame 320 and the second frame 340 that is combined with the first frame 320. According to one embodiment of the disclosure, the first frame 320 may include a first surface 3201 toward a front cover (e.g., the front cover 350 in FIG. 3), a second surface 3202 toward a rear cover (e.g., the rear cover 310 in FIG. 3) that is opposite to the first surface 3201, and a side surface 3203 that surrounds a space between the first surface 3201 and the second surface 3202. According to one embodiment of the disclosure, the first frame 320 may include an external environment detection hole 321 (e.g., the microphone hole) that is formed at a designated depth from the side surface 3203 to the direction of the space between the first surface 3201 and the second surface 3202. According to one embodiment of the disclosure, the external environment detection hole 321 may be spatially connected to an acoustic module 500 (e.g., a microphone) that is disposed in the internal space of the electronic device 300. According to one embodiment of the disclosure, the first frame 320 may include a first through hole (e.g., a first through hole 322 in FIG. 7) that is penetrated from the second surface 3202 to the external environment connection hole 321 and a second through hole (e.g., a second through hole 323 in FIG. 7) that is spaced apart from the first through hole 322 at a designated interval and that is formed to be penetrated from the second surface 3202 to the first surface 3201. According to one embodiment of the disclosure, the electronic device 300 may include a sealing member 400 that is disposed in the second surface 3202 of the first frame 320 and that connects the first through hole 322 and the second through hole 323. According to one embodiment of the disclosure, the first through hole 322 and the second through hole 323 may be disposed in a member insertion part 3204 that is formed to be lower than the second surface 3202. The sealing member 400 may be disposed in a way to be inserted into the member insertion part 3204. According to one embodiment of the disclosure, after being inserted into the member insertion part 3204, an external surface (e.g., a second member surface 420 in FIG. 6A) of the sealing member 400 may be formed to a thickness coincident with the second surface 3202. In one embodiment of the disclosure, the sealing member 400 may include a recess 430 for spatially connecting the first through hole 322 to the second through hole 323. According to one embodiment of the disclosure, the electronic device 300 may include the acoustic module 500 (e.g., a microphone) that is disposed to face the second through hole 323 in the first surface 3201. Accordingly, the electronic device 300 may include a guide path (e.g., a sound guide path) that connects the acoustic module 500 and an external environment through the external environment connection hole 321, the first through hole 322, the recess 430 of the sealing member 400, and the second through hole 323.

According to various embodiments of the disclosure, the electronic device 300 may include the second frame 340 combined with the first frame 320. According to one embodiment of the disclosure, the acoustic module 500 may be disposed in a printed circuit board 510 (e.g., the second printed circuit board 331 in FIG. 3) disposed in the second frame 340, and may be disposed to face the second through hole 323 through an operation of the first frame 320 being combined with the second frame 340.

Figure 6A:
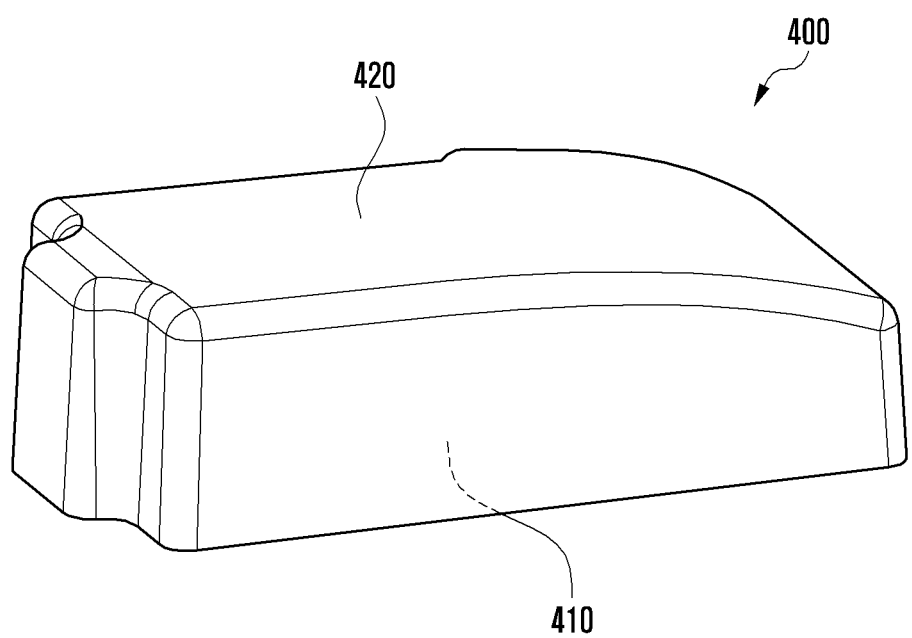
FIG. 6A is a front perspective view of a sealing member according to an embodiment of the disclosure.

FIG. 6A is a front perspective view of a sealing member according to an embodiment of the disclosure.

Figure 6B:
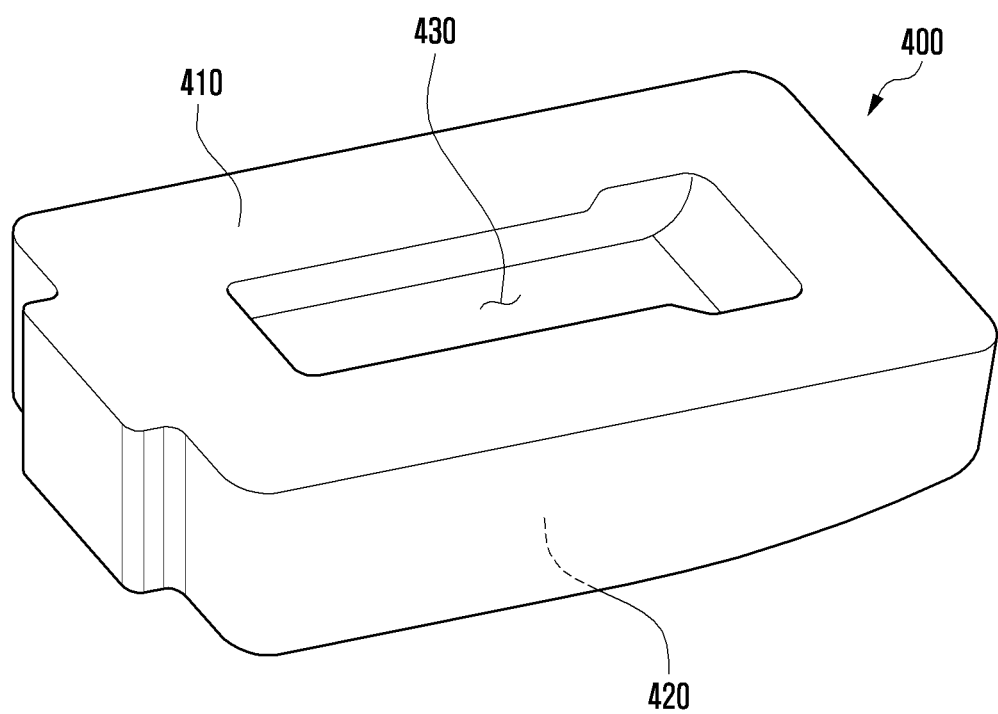
FIG. 6B is a rear perspective view of a sealing member according to an embodiment of the disclosure.

FIG. 6B is a rear perspective view of a sealing member according to an embodiment of the disclosure.

Figure 6C:
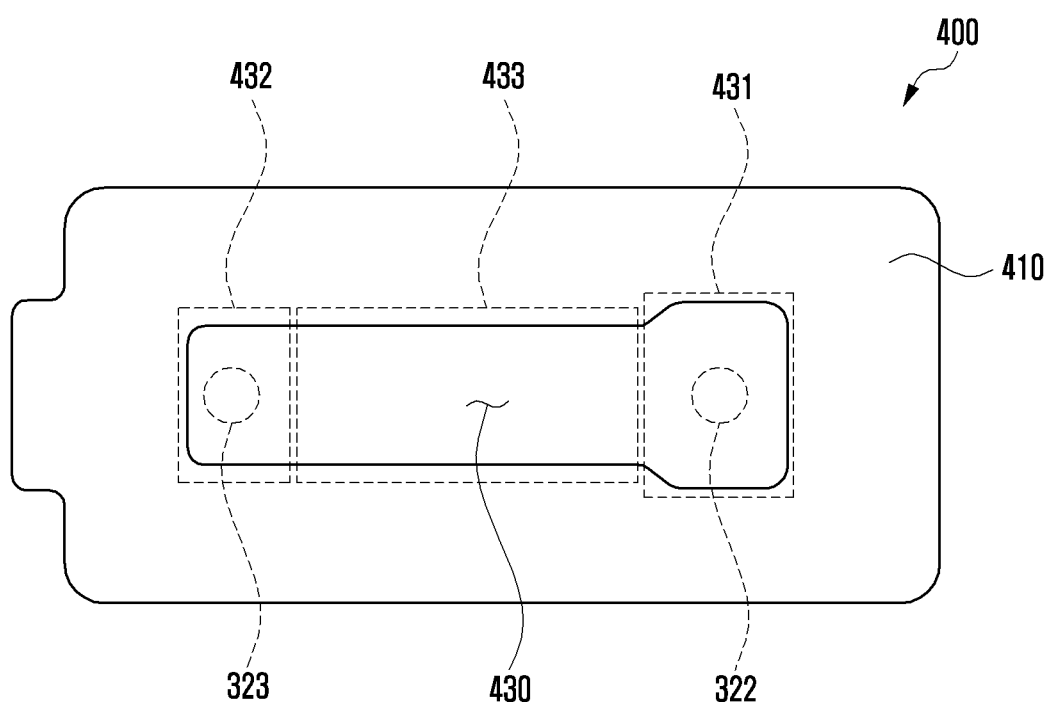
FIG. 6C is a plan view of a sealing member according to an embodiment of the disclosure.

FIG. 6C is a plan view of a sealing member according to an embodiment of the disclosure.

Referring to FIGS. 6A, 6B, and 6C, the sealing member 400 may include a first member surface 410 that faces the second surface 3202 of the first frame 320 and the second member surface 420 that faces the first member surface 410. According to one embodiment of the disclosure, the sealing member 400 may include the recess 430 formed in the first member surface 410 and having a designated depth and length. According to one embodiment of the disclosure, the recess 430 may include a first part 431 that faces the first through hole 322 of the first frame 320, a second part 432 that faces the second through hole 323 of the first frame 320, and a connection part 433 that connects the first part 431 and the second part 432. According to one embodiment of the disclosure, in order to concentrate, on the second through hole 323, a sound collected by the first through hole 322 through the external environment connection hole 321, the unit space volume of the first part 431 may be formed to be greater than the unit space volume of the second part 432. In an embodiment of the disclosure, the connection part 433 may be formed to have the unit space volume gradually reduced from the first part 431 to the direction of the second part 432.

According to various embodiments of the disclosure, the sealing member 400 may be formed of an elastic material (e.g., rubber, silicon and/or urethane) so that the first frame 320 is easily inserted into the member insertion part 3204. In an embodiment of the disclosure, the sealing member 400 may be formed of a polymer material through injection. According to one embodiment of the disclosure, the design of the sealing member 400 can be easily changed because the sealing member 400 is formed of the elastic material and/or through the injection. For example, the sealing member 400 may be formed in a corresponding shape for conformity with the second surface 3202 and for the ease of attachment to or contact with a surrounding structure (e.g., the rear cover (e.g., the rear cover 310 in FIG. 3) or an electrical structure, such as an antenna (e.g., an antenna 600 in FIG. 7)). In an embodiment of the disclosure, the second member surface 420 of the sealing member 400 may be at least partially formed in the form of a curved surface. In an embodiment of the disclosure, the second member surface 420 of the sealing member 400 may be at least partially formed to be higher or lower than an external surface thereof.

Figure 7:
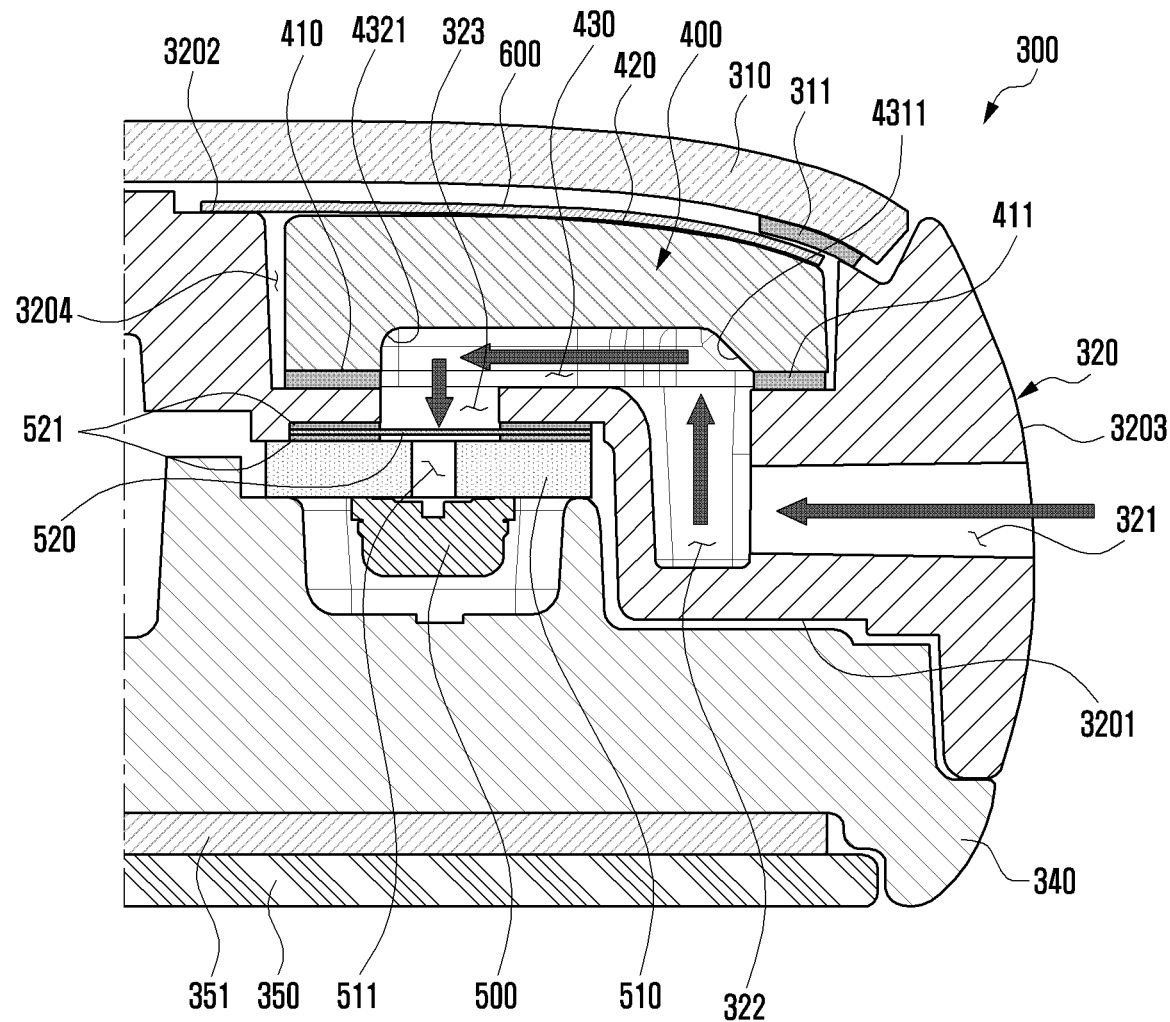
FIG. 7 is a cross-sectional view of a part of an electronic device, which is viewed from line 7-7 in FIG. 2 according to an embodiment of the disclosure.

FIG. 7 is a cross-sectional view of a part of an electronic device which is viewed from line 7-7 in FIG. 2 according to an embodiment of the disclosure.

Referring to FIG. 7, the electronic device 300 may include the rear cover 310, the front cover 350 that faces a direction opposite to the direction of the rear cover 310, the first frame 320 disposed to face the rear cover 310 in the space between the front cover 350 and the rear cover 310, the second frame 340 combined with the first frame 320 and disposed to face the front cover 350, the sealing member 400 disposed between the first frame 320 and the rear cover 310, and the acoustic module 500 disposed in the space between the first frame 320 and the second frame 340. According to one embodiment of the disclosure, the electronic device 300 may include a display 351 disposed in a way to be seen from the outside through at least a part of the front cover 350 between the second frame 340 and the front cover 350. According to one embodiment of the disclosure, the rear cover 310 may be fixed to the second surface 3202 of the first frame 320 through a double-sided tape 311 (e.g., a waterproof tape). According to one embodiment of the disclosure, the electronic device 300 may include a housing structure formed to be sealed against an external environment through the front cover 350, the rear cover 310, a part of the first frame 320 and/or a part of the second frame 340.

According to various embodiments of the disclosure, the first frame 320 may include the first surface 3201 toward the front cover 350, the second surface 3202 toward the rear cover 310 that is opposite to the first surface 3201, and the side surface 3203 that surrounds the space between the first surface 3201 and the second surface 3202. According to one embodiment of the disclosure, the side surface 3203 may be disposed as an external appearance of at least a part of the side surface 3203 of the electronic device 300. According to one embodiment of the disclosure, the first frame 320 may include the external environment connection hole 321 that is formed at a designated depth from the side surface 3203 to the direction of the space. According to one embodiment of the disclosure, the first frame 320 may include the first through hole 322 that is penetrated from the second surface 3202 to the external environment connection hole 321 and the second through hole 323 formed to be penetrated from the second surface 3202 to the first surface 3201 at a location spaced apart from the first through hole 322 at a designated interval. According to one embodiment of the disclosure, if a thickness from the first surface 3201 of the first frame 320 to the second surface 3202 thereof is not constant, the penetration depths of the first through hole 322 and the second through hole 323 may be different from each other.

According to various embodiments of the disclosure, the electronic device 300 may include the sealing member 400, including the recess 430 that is disposed in the member insertion part 3204 in which the first through hole 322 and the second through hole 323 are formed and that spatially connects the first through hole 322 and the second through hole 323, in the second surface 3202. According to one embodiment of the disclosure, the sealing member 400 may be fixed to the second surface 3202 through the double-sided tape 411 that is disposed between the first member surface 410 and the member insertion part 3204 of the second surface 3202. In an embodiment of the disclosure, the sealing member 400 may be fixed to the second surface 3202 by using various methods, such as bonding or a tight fit. According to one embodiment of the disclosure, the second member surface 420 of the sealing member 400 may include a curved surface that is at least partially formed. Such a curved surface may be formed in a shape corresponding to the curved surface part of the rear cover 310.

According to various embodiments of the disclosure, the sealing member 400 may help the smooth transfer of a sound that is introduced from or drained to the first through hole 322 because a first part (e.g., at least a part of an inner surface 4311 of the first part 431 in FIG. 6C) of the recess 430 that faces the first through hole 322 is formed in a curved shape or in the form of an inclined surface. According to one embodiment of the disclosure, the sealing member 400 may help the smooth transfer of a sound that is introduced from or drained to the second through hole 323 because at least a part of an inner surface 4321 of the second part 432 of the recess 430 that faces the second through hole 323 is also formed in a curved shape or in the form of an inclined surface.

According to various embodiments of the disclosure, the electronic device 300 may include the acoustic module 500 disposed to face the second through hole 323 in the first surface 3201 of the first frame 320. According to one embodiment of the disclosure, the acoustic module 500 may be disposed in the printed circuit board 510. When the printed circuit board 510 is disposed in the first surface 3201 of the first frame 320, the acoustic module 500 may be disposed to face the second through hole 323. In such a case, the printed circuit board 510 may include a sound through hole 511. As the sound through hole 511 faces the second through hole 323, the acoustic module 500 may also face the second through hole 323. According to one embodiment of the disclosure, the electronic device 300 may include a breathable waterproof member 520 disposed to transmit the air and to block moisture and/or a foreign substance, between the printed circuit board 510 and the first surface 3201. According to an embodiment of the disclosure, the breathable waterproof member 520 may be disposed between the second through hole 323 and the sound through hole 511 through a buffer tape 521 (e.g., a sponge tape or a poron tape). According to one embodiment of the disclosure, the breathable waterproof member 520 may include Gore-Tex, a waterproof nonwoven, or a membrane.

According to various embodiments of the disclosure, the electronic device 300 may include at least one electrical structure disposed in the second surface 3202 of the first frame 320, between the sealing member 400 and the rear cover 310. According to one embodiment of the disclosure, the second member surface 420 of the sealing member 400 may be formed in a shape corresponding to an electrical structure disposed therein. According to one embodiment of the disclosure, the electrical structure may include the antenna 600 (e.g., a pattern having a flexible printed circuit board (FPCB) form) disposed in the second surface 3202 of the first frame 320, including the second member surface 420 of the sealing member 400. In an embodiment of the disclosure, at least a part of the antenna 600 may be directly formed in the second member surface 420 of the sealing member 400. In such a case, the sealing member 400 may be formed of polymer. In an embodiment of the disclosure, the electrical structure may include a parasitic antenna which may help radiation performance of the antenna or an antenna disposed around the sealing member 400. In an embodiment of the disclosure, the antenna may be disposed only in the second member surface 420 of the sealing member 400. For example, if the sealing member 400 is formed through injection, the antenna may include a conductive pattern or laser direct structuring (LDS) pattern having a flexible printed circuit board (FPCB) form which is formed in or attached to the second member surface 420 of the sealing member 200.

According to various embodiments of the disclosure, the electronic device 300 may include a guide path (e.g., the sound guide path) that connects the acoustic module 500 and an external environment through the external environment connection hole 321, the first through hole 322, the recess 430 of the sealing member 400, and the second through hole 323. For example, according to various embodiments of the disclosure, a sound leakage phenomenon can be reduced and an assembly property can be improved because the guide path is formed in one frame (e.g., the first frame 320). Moreover, it may be advantageous in forming the guide path regardless of the thickness of a frame because two through holes (e.g., the first through hole 322 and the second through hole 323) are connected through the sealing member 400.

Figure 8A:
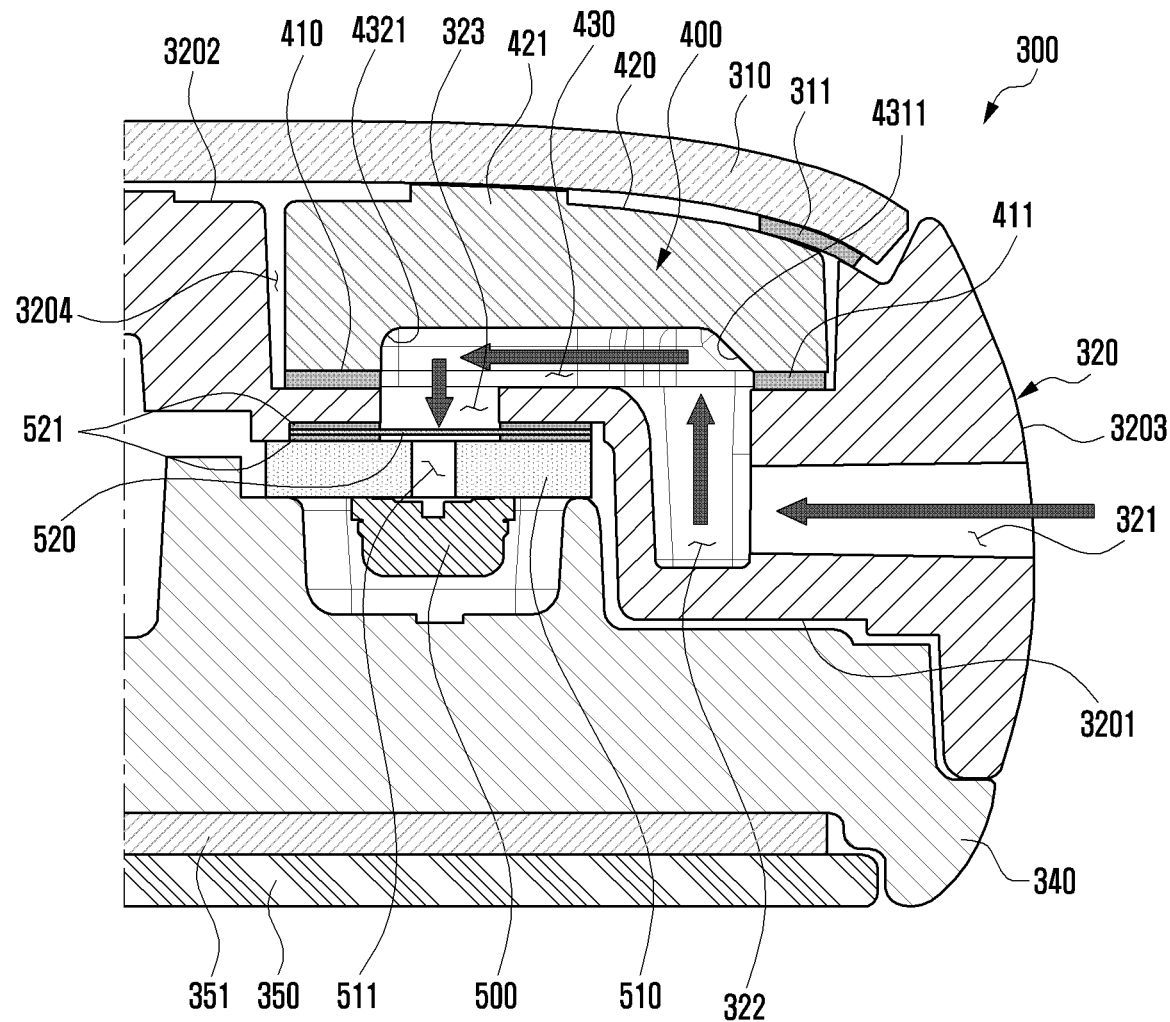
FIG. 8A is a cross-sectional view of a part of an electronic device according to an embodiment of the disclosure.

FIG. 8A is a cross-sectional view of a part of an electronic device according to an embodiment of the disclosure.

Figure 8B:
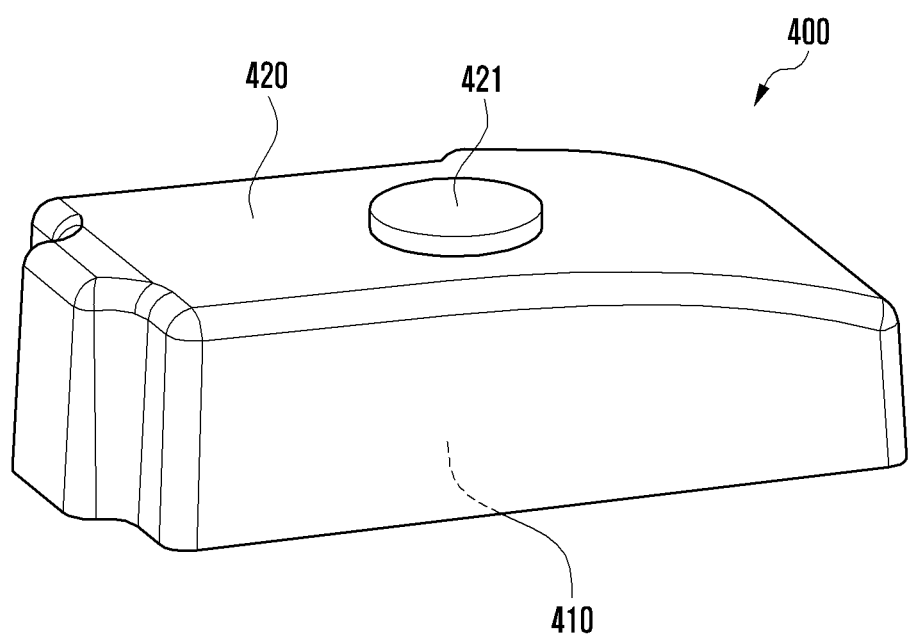
FIG. 8B is a perspective view of a sealing member applied to FIG. 8A according to an embodiment of the disclosure.

FIG. 8B is a perspective view of a sealing member applied to FIG. 8A according to an embodiment of the disclosure.

In describing the electronic device 300 and the sealing member 400 in FIGS. 8A and 8B, substantially the same components as components of the electronic device 300 and the sealing member 400 in FIG. 7 are assigned the same reference numerals, and a detailed description thereof may be omitted.

Referring to FIGS. 8A and 8B, the sealing member 400 may include a protrusion part 421 that protrudes in the direction of the rear cover 310 in at least some area of a second member surface 420. According to one embodiment of the disclosure, the protrusion part 421 may include a separate protrusion member that is integrally formed with the sealing member 400 and that is attached to the second member surface 420 of the sealing member 400. According to one embodiment of the disclosure, the protrusion part 421 may help a reduction in the vibration of the electronic device 300 and/or a buffer action according to the falling of the electronic device 300 because the protrusion part 421 is disposed in a way to overlap a surrounding structure (e.g., the rear cover 310) disposed around the sealing member 400.

Figure 9A:
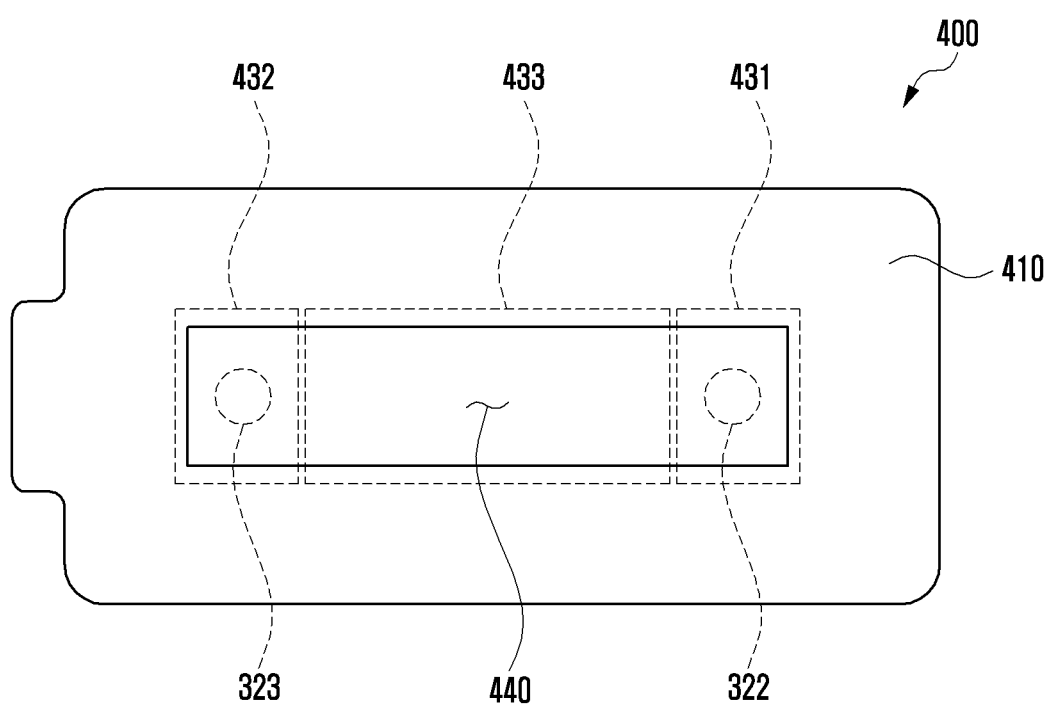
FIGS. 9A, 9B, and 9C are plan views of a sealing member having a recess according to various embodiments of the disclosure.
Figure 9B:
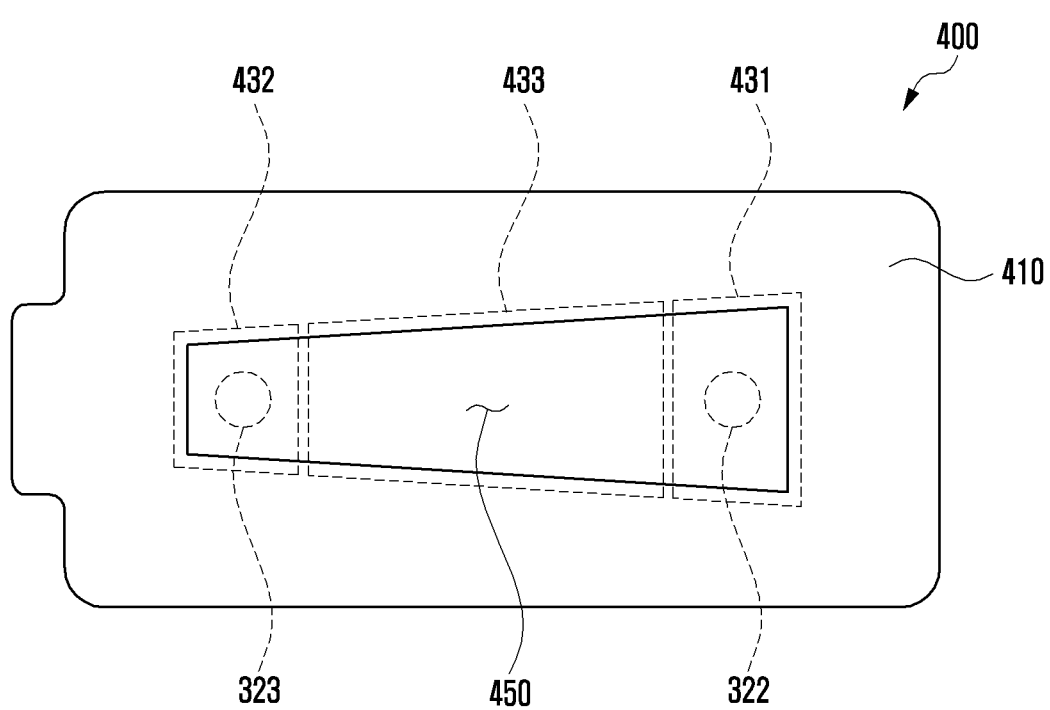
Figure 9C:
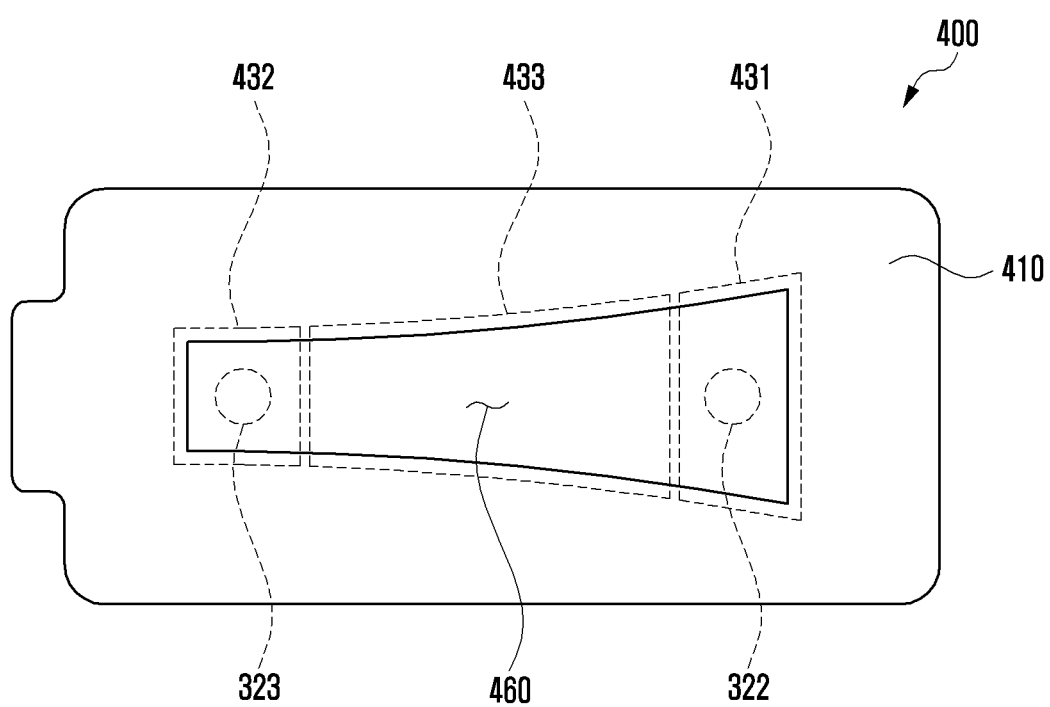

FIGS. 9A, 9B, and 9C are plan views of a sealing member having a recess according to various embodiments of the disclosure.

Referring to FIG. 9A, the sealing member 400 may include a recess 440 formed in the first member surface 410 at a designated depth and length. According to one embodiment of the disclosure, the recess 440 may include a first part 431 that is formed in a first frame (e.g., the first frame 320 in FIG. 7) and that faces the first through hole 322, a second part 432 that faces the second through hole 323, and the connection part 433 that connects the first part 431 and the second part 432. According to one embodiment of the disclosure, the recess 440 may be formed so that the first part 431, the second part 432, and the connection part 433 have the same volume per unit space.

Referring to FIGS. 9B and 9C, the recess 450, 460 of the sealing member 400 may be formed to have the volume per unit space gradually reduced as the recess proceeds from the first part 431 to the second part 432. In such a case, this may help the improvement of performance of an acoustic module (e.g., the acoustic module 500 in FIG. 7) because an external sound introduced through the first through hole 322 of the first part 431 is concentrated on the second through hole 323 of the second part 432. According to one embodiment of the disclosure, the recess 450, 460 may be formed in the form of a straight line or a curved line the width of which is gradually narrowed as the recess proceeds from the first part 431 to the second part 432.

Various embodiments of the disclosure have illustrated and described the acoustic module 500 that collects an external sound or discharges a sound through the guide path that connects to an external environment, but the disclosure is not limited thereto. For example, the acoustic module 500 may be substituted with various electrical structures capable of detecting an external environment through the guide path.

For example, such an electrical structure may include at least one of a gas sensor, an odor sensor, a temperature sensor, or a dust sensor.

Figure 10A:
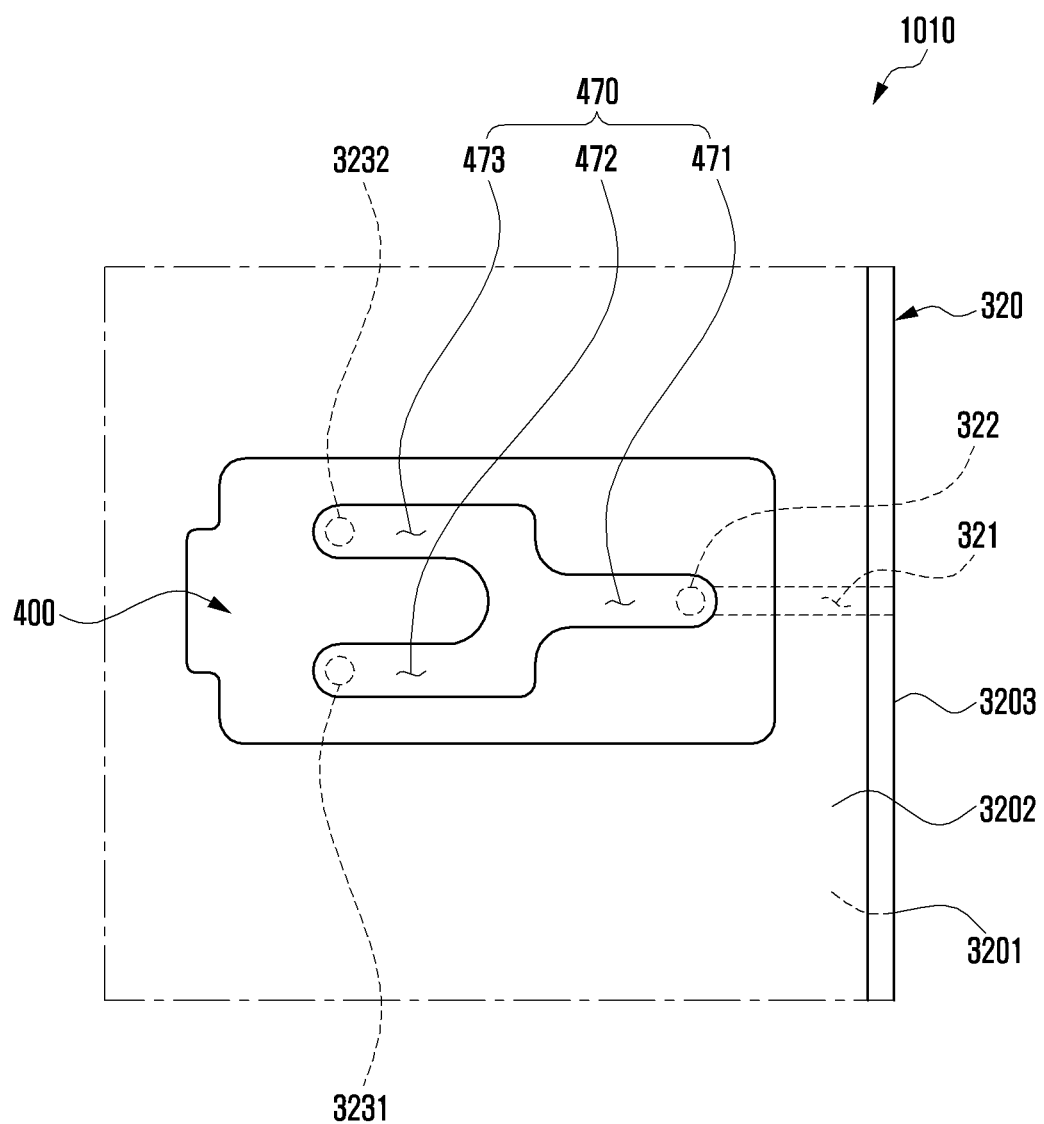
FIGS. 10A and 10B are diagrams schematically illustrating a state in which a sealing member has been disposed in a frame according to various embodiments of the disclosure.
Figure 10B:
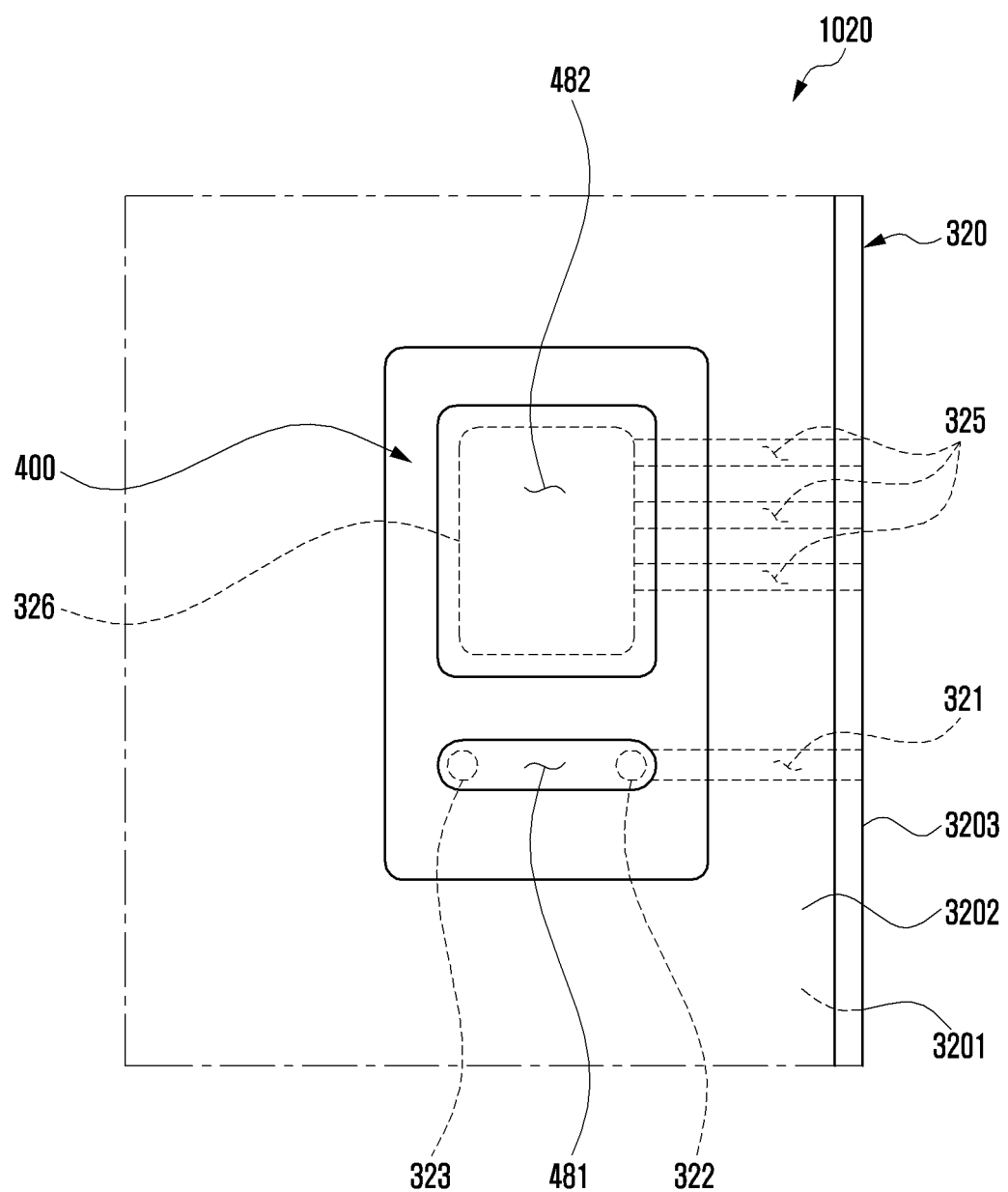

FIGS. 10A and 10B are diagrams schematically illustrating a state in which a sealing member has been disposed in a frame according to various embodiments of the disclosure.

Referring to FIGS. 10A and 10B, according to various embodiments of the disclosure, an electronic device 1010, 1020 may include a multi-guide path for electrical structures having different functions by using at least one external environment connection hole 321, 325 and a plurality of through holes 322, 3231, 3232, 323, 326 formed in the first frame 320 (e.g., the first frame 320 in FIG. 7) and recesses 470, 481, 482 of the sealing member 400.

Referring to FIG. 10A, the electronic device 1010 (e.g., the electronic device 300 in FIG. 7) may include the first frame 320 and the sealing member 400 disposed in at least some area of the first frame 320. According to one embodiment of the disclosure, the first frame 320 may include a first surface 3201, a second surface 3202 toward a direction that is opposite to the first surface 3201, and the side surface 3203 that at least partially surrounds a space between the first surface 3201 and the second surface 3202. According to one embodiment of the disclosure, the first frame 320 may include the external environment connection hole 321 formed from the side surface 3203 to the direction of an internal space thereof in a designated length, a first through hole 322 formed from the second surface 3202 to the external environment connection hole 321, a second through hole 3231 that is disposed to be spaced apart from the first through hole 322 at a designated interval and that is penetrated from the second surface 3202 to the first surface 3201, and a third through hole 3232 that is disposed to be spaced apart from the first through hole 321 and the second through hole 3231 at a designated interval and that is penetrated from the second surface 3202 to the first surface 3201.

According to various embodiments of the disclosure, the sealing member 400 may include the recess 470 that is disposed in the second surface 3202 of the first frame 320 and that faces the first through hole 322, the second through hole 3231, and the third through hole 3232. According to one embodiment of the disclosure, the recess 470 may include a first recess part 471 that faces the first through hole 322, a second recess part 472 that extends from the first recess part 471 and that faces the second through hole 3231, and a third recess part 473 that is branched from the first recess part 471 and that faces the third through hole 3232. According to one embodiment of the disclosure, the electronic device 1010 may include a first electrical structure (not illustrated) disposed to face the second through hole 3231, in the first surface 3201 of the first frame 320, and a second electrical structure (not illustrated) disposed to face the third through hole 3232, in the first surface 3201 of the first frame 320. According to one embodiment of the disclosure, the first electrical structure may include an acoustic module. According to one embodiment of the disclosure, the second electrical structure may include at least one sensor for detecting an external environment. According to one embodiment of the disclosure, the at least one sensor may include a gas sensor, an odor sensor, a temperature sensor, or a dust sensor.

Referring to FIG. 10B, the electronic device 1020 (e.g., the electronic device 300 in FIG. 7) may include a first frame 320 and a sealing member 400 disposed in at least some area of the first frame 320. According to one embodiment of the disclosure, the first frame 320 may include a first surface 3201, a second surface 3202 toward a direction that is opposite to the direction of the first surface 3201, and the side surface 3203 that at least partially surrounds a space between the first surface 3201 and the second surface 3202. According to one embodiment of the disclosure, the first frame 320 may include a first external environment connection hole 321 that is formed from the side surface 3203 to the direction of an internal space thereof in a designated length, and a plurality of second external environment connection holes 325 that are formed from the side surface 3203 to the directions of internal spaces thereof in a designated length, at a location spaced apart from the first external environment hole 321 at a designated interval. According to one embodiment of the disclosure, the first external environment connection hole 321 may be used as a part of a guide path for an acoustic module and/or various sensors. According to one embodiment of the disclosure, the plurality of second external environment connection holes 325 may be used as a part of a guide path for a speaker. According to one embodiment of the disclosure, the first frame 320 may include a first through hole 322 that is formed from the second surface 3202 to the first external environment connection hole 321, and a second through hole 323 that is disposed to be spaced apart from the first through hole 322 at a designated interval and that is penetrated from the second surface 3202 to the first surface 3201. According to one embodiment of the disclosure, the first frame 320 may include a third through hole 326 that is penetrated from the second surface 3202 to the first surface 3201 and that is formed in a way to be connected to the plurality of second through holes 325.

According to various embodiments of the disclosure, the sealing member 400 may include a first recess 481 that is disposed in the second surface 3202 of the first frame 320 and that faces both the first through hole 322 and the second through hole 323, and a second recess 482 that is disposed to be spaced apart from the first recess 481 at a designated interval and that faces the third through hole 326. According to one embodiment of the disclosure, the electronic device 300 may include a first electrical structure (not illustrated) disposed to face the second through hole 323 in the first surface 3201 of the first frame 320, and a second electrical structure (not illustrated) disposed to face the third through hole 326 in the first surface 3201 of the first frame 320. According to one embodiment of the disclosure, the first electrical structure may include a microphone and/or at least one sensor. According to one embodiment of the disclosure, the second electrical structure may include a speaker.

In an embodiment of the disclosure, an electronic device may include at least one guide path that has various shapes and numbers and that is provided integrally or independently through a plurality of through holes formed in the first frame and a plurality of recesses formed in the first member surface of the sealing member.

According to various embodiments of the disclosure, an electronic device (e.g., the electronic device 300 in FIG. 7) may include a first frame (e.g., the first frame 320 in FIG. 7) including a first surface (e.g., the first surface 3201 in FIG. 7), a second surface (e.g., the second surface 3202 in FIG. 7) toward a direction opposite to the direction of the first surface, and a side surface (e.g., the side surface 3203 in FIG. 7) that surrounds a space between the first surface and the second surface, a guide path including an external environment connection hole (e.g., the external environment connection hole 321 in FIG. 7) formed at a designated depth from the side surface to the direction of the space, a first through hole (e.g., the first through hole 322 in FIG. 7) formed from the second surface to the external environment connection hole, and a second through hole (e.g., the second through hole 323 in FIG. 7) formed to be penetrated from the first surface to the second surface at a location spaced apart from the first through hole as a guide path formed in the space of the first frame, an acoustic module (e.g., the acoustic module 500 in FIG. 7) disposed to face the second through hole in the first surface, and a sealing member (e.g., the sealing member 400 in FIG. 7) including a recess (e.g., the recess 430 in FIG. 7) that is disposed in the second surface and that connects the first through hole and the second through hole.

According to various embodiments of the disclosure, the sealing member may include a first member surface facing the second surface and a second member surface formed in a direction opposite to the direction of the first member surface. The recess may be formed to be lower than the first member surface.

According to various embodiments of the disclosure, the recess may include a first part (e.g., the first part 431 in FIG. 6C) facing the first through hole, a second part (e.g., the second part 432 in FIG. 6C) facing the second through hole, and a connection part (e.g., the connection part 433 in FIG. 6C) connecting the first part and the second part. The first part, the second part and/or the connection part may be formed to have different unit space volumes.

According to various embodiments of the disclosure, a unit space volume of the first part of the recess may be formed to be greater than a unit space volume of the second part.

According to various embodiments of the disclosure, the recess may be formed to have a unit space volume gradually reduced as the recess proceeds from the first part to the second part.

According to various embodiments of the disclosure, an inner surface of the first part and/or the second part may be at least partially inclined or may be formed in the form of a curved surface.

According to various embodiments of the disclosure, the sealing member may be disposed in a member insertion part formed to be lower than the second surface, in the second surface. The second member surface may be formed in a shape coincident with the second surface.

According to various embodiments of the disclosure, at least a part of the second member surface may be formed to have a curved surface.

According to various embodiments of the disclosure, the rear cover disposed in the second surface may be further included. At least one electrical structure disposed to include at least a part of the second member surface between the second surface and the rear cover may be further included.

According to various embodiments of the disclosure, the electrical structure may include an antenna.

According to various embodiments of the disclosure, a protrusion part disposed to protrude more than the second member surface in the second member surface may be further included. The protrusion part may come into contact with the rear cover with a designated overlap therewith.

According to various embodiments of the disclosure, a second frame at least partially connected to the first frame may be further included. The acoustic module may be disposed to be supported by the second frame.

According to various embodiments of the disclosure, a breathable waterproof member disposed between the acoustic module and the second through hole may be further included.

According to various embodiments of the disclosure, a front cover disposed in the second frame may be further included. A display disposed in a way to be seen from the outside through the front cover in an internal space of the electronic device may be further included.

According to various embodiments of the disclosure, the acoustic module may include a microphone or a speaker.

According to various embodiments of the disclosure, an electronic device (e.g., the electronic device 300 in FIG. 7) may include a first frame (e.g., the first frame 320 in FIG. 7) including a first surface (e.g., the first surface 3201 in FIG. 7), a second surface (e.g., the second surface 3202 in FIG. 7) toward a direction opposite to the direction of the first surface, and a side surface (e.g., the side surface 3203 in FIG. 7) that surrounds a space between the first surface and the second surface, a guide path including an external environment connection hole (e.g., the external environment connection hole 321 in FIG. 7) formed at a designated depth from the side surface to the direction of the space, a first through hole (e.g., the first through hole 322 in FIG. 7) formed from the second surface to the external environment connection hole, and a second through hole (e.g., the second through hole 323 in FIG. 7) formed to be penetrated from the first surface to the second surface at a location spaced apart from the first through hole as a guide path formed in the space of the first frame, an electrical structure (e.g., the acoustic module 500 in FIG. 7) disposed to correspond to the second through hole in the first surface, and a sealing member (e.g., the sealing member 400 in FIG. 7) including a recess (e.g., the recess 430 in FIG. 7) that is disposed in the second surface and that connects the first through hole and the second through hole.

According to various embodiments of the disclosure, the sealing member may include a first member surface facing the second surface and a second member surface formed in a direction opposite to the direction of the first member surface. The recess may be formed to be lower than the first member surface.

According to various embodiments of the disclosure, the recess may include a first part facing the first through hole, a second part facing the second through hole, and a connection part connecting the first part and the second part. The first part, the second part and/or the connection part may be formed to have different unit space volumes.

According to various embodiments of the disclosure, a unit space volume of the first part of the recess may be formed to be greater than a unit space volume of the second part.

According to various embodiments of the disclosure, the electrical structure may include at least one of a microphone, a speaker, a gas sensor, an odor sensor, a temperature sensor, or a dust sensor.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first frame including a first surface facing a first direction, a second surface facing a second direction opposite to the first direction, and a side surface;
a guide path formed in a space between the first surface and the second surface, the guide path comprising:
an external environment connection hole formed in the side surface and extending at a designated depth from the side surface to the space,
a first through hole formed from the second surface to the external environment connection hole, and
a second through hole penetrating from the first surface to the second surface at a location spaced apart from the first through hole, wherein the first through hole and the second through hole for at least part of the guide path in the space of the first frame;
an acoustic module disposed to correspond to the second through hole in the first surface; and
a sealing member including a recess, the sealing member being disposed in the second surface and the recess connecting the first through hole and the second through hole.

2. The electronic device of claim 1,
wherein the sealing member further includes a first member surface facing the second surface and a second member surface formed in a direction opposite to a direction of the first member surface, and
wherein the recess is formed to be lower than the first member surface.

3. The electronic device of claim 2,
wherein the recess comprises a first part facing the first through hole, a second part facing the second through hole, and a connection part connecting the first part and the second part,
wherein the first part, the second part, and the connection part are formed to have different unit space volumes.

4. The electronic device of claim 3, wherein a first unit space volume of the first part facing the first through hole is formed to be greater than a second unit space volume of the second part facing the second through hole.

5. The electronic device of claim 3, wherein the recess is formed to have a unit space volume that gradually reduces from the first part to the second part.

6. The electronic device of claim 3, wherein an inner surface of the first part and the second part is at least partially inclined or is formed in a curved surface form.

7. The electronic device of claim 2,
wherein the sealing member is disposed in a member insertion part formed to be lower than the second surface, in the second surface, and
wherein the second member surface is formed in a shape coincident with the second surface.

8. The electronic device of claim 7, wherein at least a part of the second member surface is formed to have a curved surface.

9. The electronic device of claim 2, further comprising:
a rear cover disposed on the second surface; and
at least one electrical structure disposed to include at least a part of the second member surface between the second surface and the rear cover.

10. The electronic device of claim 9, wherein the at least one electrical structure comprises an antenna.

11. The electronic device of claim 9, further comprising:
a protrusion part disposed to protrude more than the second member surface in the second member surface,
wherein the protrusion part comes into contact with the rear cover with a designated overlap therewith.

12. The electronic device of claim 2, further comprising:
a second frame at least partially connected to the first frame,
wherein the acoustic module is disposed to be supported by the second frame.

13. The electronic device of claim 12, further comprising:
a breathable waterproof member disposed between the acoustic module and the second through hole.

14. The electronic device of claim 12, further comprising:
a front cover disposed on the second frame; and a display disposed to be seen from outside the electronic device through the front cover in an internal space of the electronic device.

15. The electronic device of claim 1, wherein the acoustic module includes at least one of a microphone or a speaker.

16. An electronic device comprising:
a first frame including a first surface facing a first direction, a second surface facing a second direction opposite to the first direction, and a side surface;
a guide path formed in a space between the first surface and the second surface, the guide path comprising:
an external environment connection hole formed in the side surface and extending at a designated depth from the side surface to the space,
a first through hole formed from the second surface to the external environment connection hole, and
a second through hole penetrating from the first surface to the second surface at a location spaced apart from the first through hole, wherein the first through hole and the second through hole form at least part of the guide path in the space of the first frame;
an electrical structure disposed to correspond to the second through hole in the first surface; and
a scaling member including a recess, the sealing member being disposed in the second surface and the recess connecting the first through hole and the second through hole.

17. The electronic device of claim 16,
wherein the sealing member further includes a first member surface facing the second surface and a second member surface formed in a direction opposite to the direction of the first member surface, and
wherein the recess is formed to be lower than the first member surface.

18. The electronic device of claim 17,
wherein the recess includes a first part facing the first through hole, a second part facing the second through hole, and a connection part connecting the first part and the second part, and
wherein the first part, the second part and the connection part are formed to have different unit space volumes.

19. The electronic device of claim 18, wherein a first unit space volume of the first part facing the first through hole is formed to be greater than a second unit space volume of the second part facing the second through hole.

20. The electronic device of claim 16, wherein the electrical structure includes at least one of a microphone, a speaker, a gas sensor, an odor sensor, a temperature sensor, or a dust sensor.

* * * * *